(12) United States Patent
Kim et al.

(10) Patent No.: US 8,158,958 B2
(45) Date of Patent: Apr. 17, 2012

(54) FLARE EVALUATION METHODS

(75) Inventors: In-Sung Kim, Suwon-si (KR); Jooon Park, Suwon-si (KR); Doo-Hoo Goo, Hwaseong-si (KR); Jeong-Hoon Lee, Yongin-si (KR); Chang-Min Park, Hwaseong-si (KR)

(73) Assignee: Samsung Electronics Co. Ltd., Suwon-Si, Gyeonggi-Do (KR)

( * ) Notice: Subject to any disclaimer, the term of this patent is extended or adjusted under 35 U.S.C. 154(b) by 126 days.

(21) Appl. No.: 12/732,960

(22) Filed: Mar. 26, 2010

(65) Prior Publication Data
US 2010/0258744 A1    Oct. 14, 2010

(30) Foreign Application Priority Data
Apr. 8, 2009 (KR) .................. 10-2009-0030510

(51) Int. Cl.
*G01T 1/04* (2006.01)
(52) U.S. Cl. .................................................. 250/473.1
(58) Field of Classification Search ............... 250/473.1; 355/69, 77; 430/5, 319
See application file for complete search history.

(56) References Cited

U.S. PATENT DOCUMENTS

| 7,277,165 B2 | 10/2007 | Wu et al. |
| 2004/0023130 A1* | 2/2004 | Yao et al. ........................... 430/5 |
| 2005/0216878 A1* | 9/2005 | Word et al. ..................... 716/21 |
| 2005/0270523 A1* | 12/2005 | Wu et al. .................... 356/237.5 |

FOREIGN PATENT DOCUMENTS

| JP | 2001-272766 | 10/2001 |
| JP | 2004-064024 | 2/2004 |

OTHER PUBLICATIONS

A.M. Myers, et al., "Experimental Validation of Full-Field Extreme Ultraviolet Lithography Flare and Shadowing Corrections," J. Vac Sci. Technol. B 26(6), Nov./Dec. 2008.

Christof Krautschik, et al., "Impact of EUV Light Scatter on CD Control as a Result of Mask Density Changes," pp. 289-301, Emerging Lithographic Technologies VI, Roxann L. Engelstad, Editor Proceedings of SPIE vol. 4688 (2002).

* cited by examiner

*Primary Examiner* — Kiho Kim
(74) *Attorney, Agent, or Firm* — F. Chau & Associates, LLC

(57) ABSTRACT

A flare evaluation method includes: extracting DC flare reference data using a preliminary measurement pattern mask and a dummy mask having an open region in which a preliminary measurement pattern is formed; providing a plurality of flare gauge sets including an opaque pad, a measurement pattern, and a flare pattern, the measure pattern being disposed at an inside of the opaque pad to measure strength of a flare, the flare pattern being disposed at an outside of the opaque pad to generate the flare; and detecting a change of a photo resist measurement pattern caused by the flare pattern and the measurement pattern for each of the flare gauge sets, wherein an outer radius of the flare pattern increases by a predetermined amount depending on the flare gauge set.

20 Claims, 21 Drawing Sheets

FLARE EVALUATION METHODS

CROSS-REFERENCE TO RELATED APPLICATIONS

This U.S. non-provisional patent application claims priority under 35 U.S.C. §119 from Korean Patent Application No. 10-2009-0030510, filed on Apr. 8, 2009, the contents of which are herein incorporated by reference in their entirety.

BACKGROUND

The present disclosure is directed to flare evaluation methods, and more particularly, to extreme ultraviolet (EUV) flare evaluation methods.

In general, an optical flare of a lithography optical apparatus can be measured using a pad disappearing method in which circular, linear, or rectangular pads of various sizes disappear in a flare environment.

SUMMARY

The present disclosure describes methods that can easily measure a long range flare and can at the same time extract a flare Point Spread Function (PSF).

Embodiments of the inventive concept provide flare evaluation methods of an extreme ultraviolet (EUV) exposure apparatus, the methods including: extracting direct constant (DC) flare reference data using a preliminary measurement pattern mask including a dummy mask having an open region where a preliminary measurement pattern is formed; providing a plurality of flare gauge sets, each set including an opaque pad, a measurement pattern, and a flare pattern, the measure pattern being disposed at an inside of the opaque pad to measure influence of a flare, the flare pattern being disposed at an outside of the opaque pad to generate the flare; and detecting a change of a photo resist measurement pattern caused by the flare pattern and the measurement pattern for each of the flare gauge sets, wherein an outer radius of the flare pattern increases by a predetermined amount according to the flare gauge set.

In some embodiments, the methods further may include obtaining a point spread function (PSF) using the DC flare reference data and the change of the photo resist measurement pattern.

In other embodiments, extracting the DC flare reference data may include: providing the preliminary measurement pattern mask including the preliminary measurement pattern; forming a photo resist preliminary measurement pattern by exposing a photo resist through the preliminary measurement pattern mask; exposing the photo resist preliminary measurement pattern to a DC flare through the dummy mask having the open region where the preliminary measurement pattern is formed; and measuring a width change of the photo resist preliminary measurement pattern caused by the DC flare.

In still other embodiments, an inner radius of the flare pattern may be uniform in the flare gauge set.

In even other embodiments, a shape of the flare pattern may be a truncated round washer disposed symmetrically about the opaque pad.

In yet other embodiments, an angle of the truncated round washer may be between more than 0° and less than 180°.

In further embodiments, the truncated round washer may be disposed in a horizontal direction or a vertical direction to measure an anisotropy in the flare pattern.

In still further embodiments, the measurement pattern may include a either a line/space pattern or a hole pattern.

In even further embodiments, a width of the measurement pattern may be less than a wavelength of the EUV exposure apparatus.

In yet further embodiments, the methods further may include a dark pattern between the opaque pattern and the flare pattern, wherein an outer radius of the dark pattern is reduced by a predetermined amount from the outer radius of the flare pattern.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept.

DETAILED DESCRIPTION OF THE EMBODIMENTS

Figure 1:
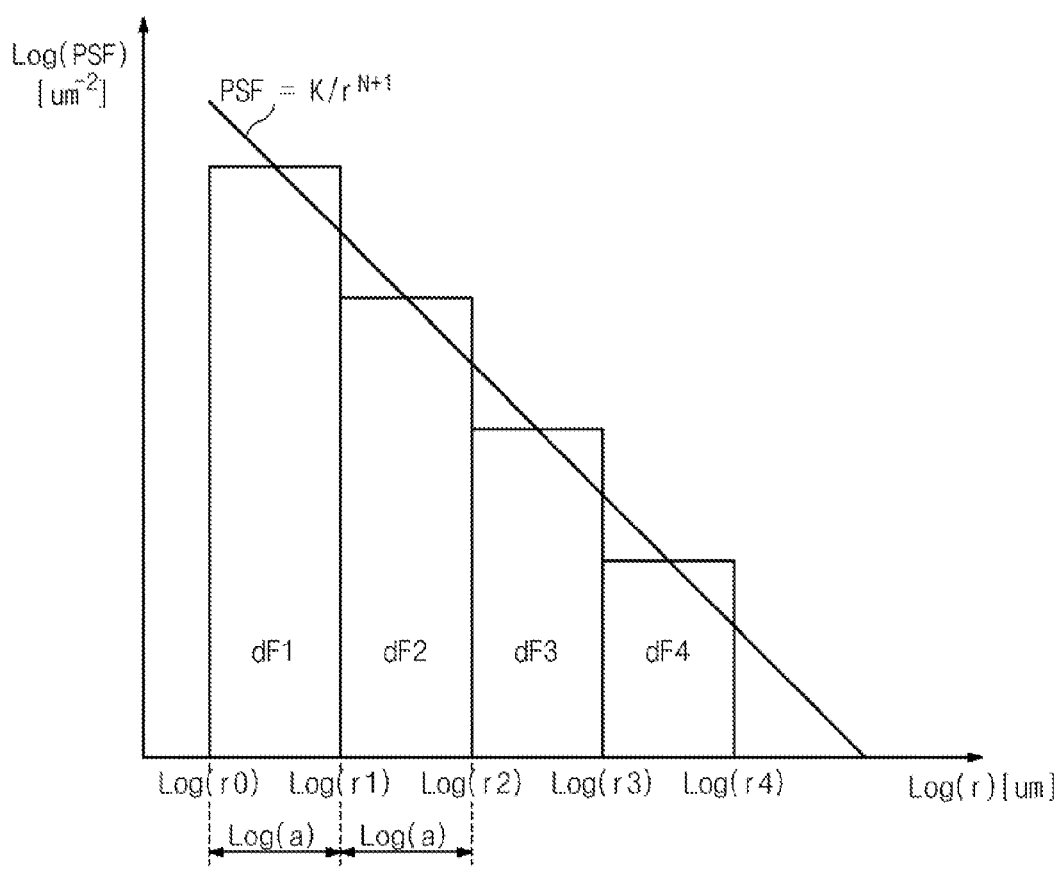
FIG. 1 is a view illustrating how a PSF is estimated, according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein.

A flare evaluation method according to an embodiment of the inventive concept provides a mask design that can measure an optical flare quantitatively in an extreme ultraviolet (EUV) lithography optical apparatus using a mirror.

An optical flare may deteriorate contrast of a lithographic image that needs high resolution. Accordingly, to obtain a high-quality image on a substrate, the optical flare should be reduced or removed. The optical flare may be generated by a scattering source or by multiple reflections on an optical path. The optical flare is proportional to surface roughness and inversely proportional to the fourth power of an exposure wavelength (or, the second power of a mirror) as a function of surface roughness of a lens or a mirror and an exposure source wavelength.

An EUV lithography exposure apparatus produces a spectral line of about 13.5 nm wavelength, as compared to a deep ultraviolet (DUV) argon fluoride (ArF) lithography exposure, which produces a spectral line of about 193 nm wavelength. When a technique for processing a same surface is used as a precondition, a lens (or a mirror) in an EUV lithography exposure apparatus expects an optical flare of more than about $(193/13.5)^2$ (i.e., about 200 times) greater than that of an ArF lithography exposure apparatus. An actual EUV exposure apparatus uses two to eight mirrors, fewer than the number of mirrors in an ArF exposure apparatus, which uses several tens of mirrors. Note that a mirror has half the number of surfaces of a refractive lens. Therefore, an EUV optical flare is expected to be about 10 to 20 times greater in magnitude than that of an ArF optical flare.

The optical flare may be described using a Point Spread Function (PSF) derived from the mirror surface roughness of an exposure apparatus. The PSF can be approximated as $1/r^{N+1}$ (i.e., a power function). The PSF is inversely proportional to the N+1 power of the distance and can have influence over a range of several to several tens of mm, depending on the surface processing technique. If a specific geometric structure is given, the optical flare can be converted into the PSF.

A typical pad disappearing method may use a photo resist. For a photo resist having a threshold energy of $E_0$, if an exposure energy required for disappearing a pad of various sizes is E, the optical flare can be described by the formula $(E_0/E) \times 100$. This method is limited by a requirement for a large pad to measure the long range flare. A long exposure is required to completely disappear the large pad. Accordingly, an exposure apparatus should have sufficient power. In addition, for a typical EUV photo resist, an EUV photon energy may be about 92 eV. Accordingly, before a pad completely disappears, photo resist cross-linking in a clear region outside the pad being exposed may cause a photo resist to reappear. Therefore, the pad may not completely disappear. As a result, measuring a long range flare may be challenging, and the PSF for the flare characteristic may be undefined.

FIG. 1 is a view illustrating how a PSF is estimated, according to an embodiment of the inventive concept.

Referring to FIG. 1, a measurement pattern, such as a line and space pattern (LS pattern) or a contact hole pattern, both of which can yield a result with a short exposure, can be used as a sensor. A local flare in an area where an LS pattern image is placed can serve as a direct constant (DC) intensity Idc. The DC intensity Idc may cause a width change in the LS pattern image. Using the change of the width of the LS pattern image, the local flare and/or a PSF can be derived.

Flare patterns of various shapes may be placed at various distances about the LS pattern. A flare having a particular flare pattern with a predetermined shape is measured at various distances to model the flare characteristic.

The PSF may be a $1/r^{N+1}$ function, where r is a distance from a point light source, and N is a real number. Accordingly, in an image plane, the PSF may be described by Log(PSF)–Log(r) in a logarithmic scale. In the logarithmic scale, an x-axis satisfies a relationship of $r_{n+1}=a \times r_n$. A differential flare ($dF_{n+1}$) is measured by the interval $Log(r_{n+1})-Log(r_n)=Log(a)$, as depicted in FIG. 1, to determine a value of (N+1). Once the (N+1) value is determined, the PSF can be modeled.

Figure 2A:
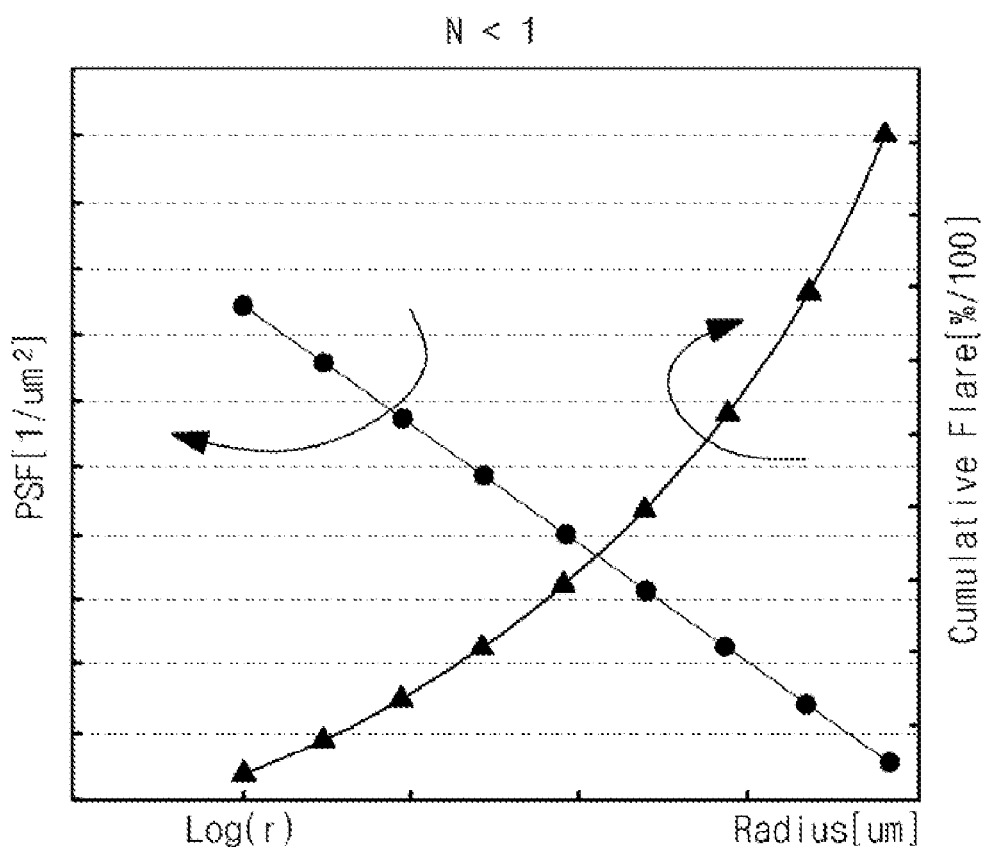
FIGS. 2A through 2C are views illustrating a PSF and a cumulative flare according to an embodiment of the inventive concept.
Figure 2B:
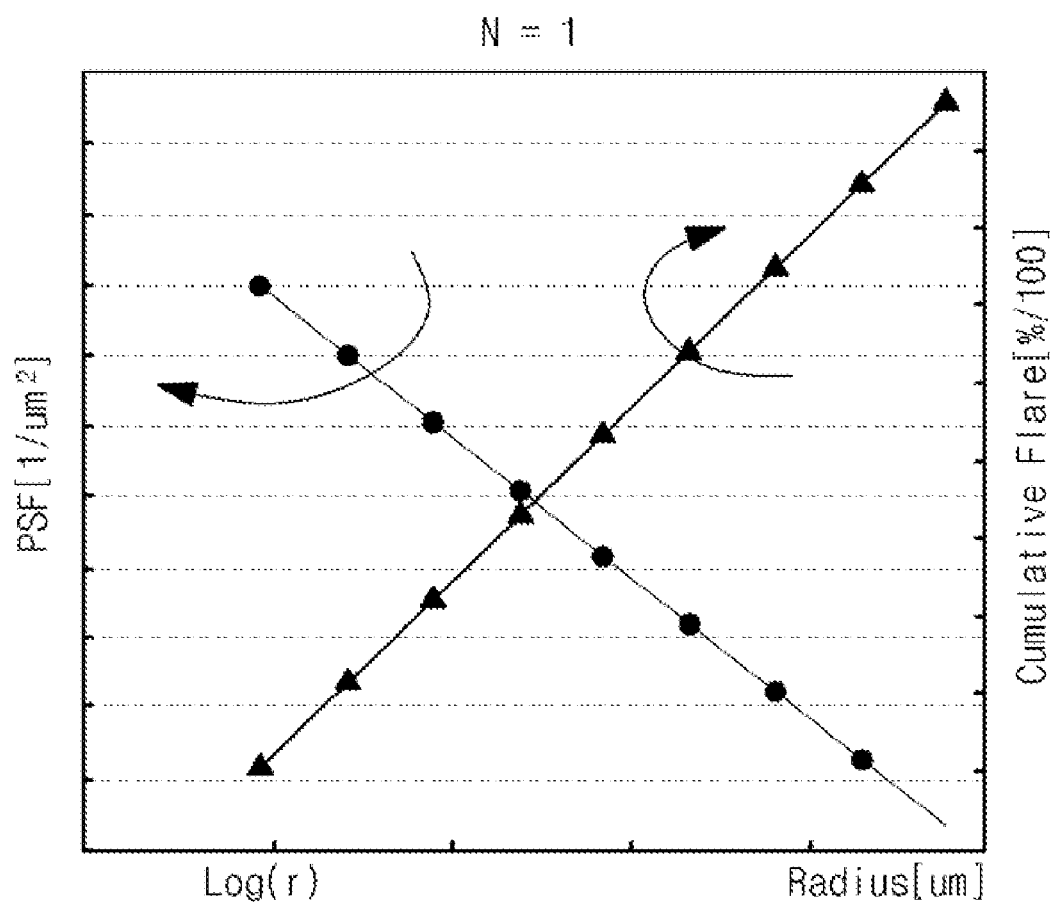
Figure 2C:
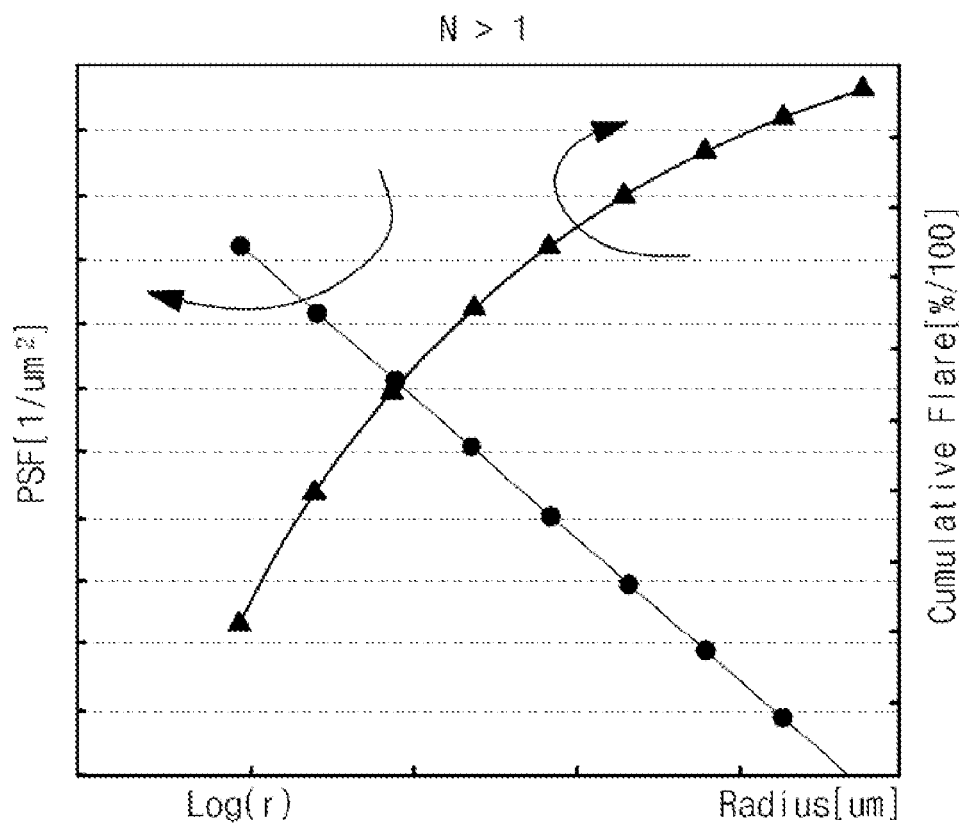

FIGS. 2A through 2C are views illustrating a PSF and a cumulative flare according to an embodiment of the inventive concept.

Referring to FIGS. 2A through 2C, within a predetermined range, partial sums of the flare value accumulated over the intervals may diverge or converge, depending on a value of N. The distance axis (the x-axis) is a logarithmic scale of distance.

Referring to FIG. 2A, if N<1, the cumulative flare value diverges. In the Log(PSF)–Log(r) graph, the PSF can be fit to a linear function.

Referring to FIG. 2B, if N=1, since differential flare values of all intervals are the same, the cumulative flare value can be represented by a linear function, and in the Log(PSF)–Log(r) graph, the PSF can also be fit to a linear function.

Referring to FIG. 2C, if N>1, the cumulative flare value converges to a limit, and in the Log(PSF)–Log(r) graph, the PSF can be fit to a linear function.

Once the PSF is obtained, an actual mask can be represented by convolving the PSF with a target pattern ($I_0(x,y)$):

$$I(x,y)=I_0(x,y)+I_0(x,y) \otimes PSF(x,y). \qquad \text{[Equation 1]}$$

Figure 3:
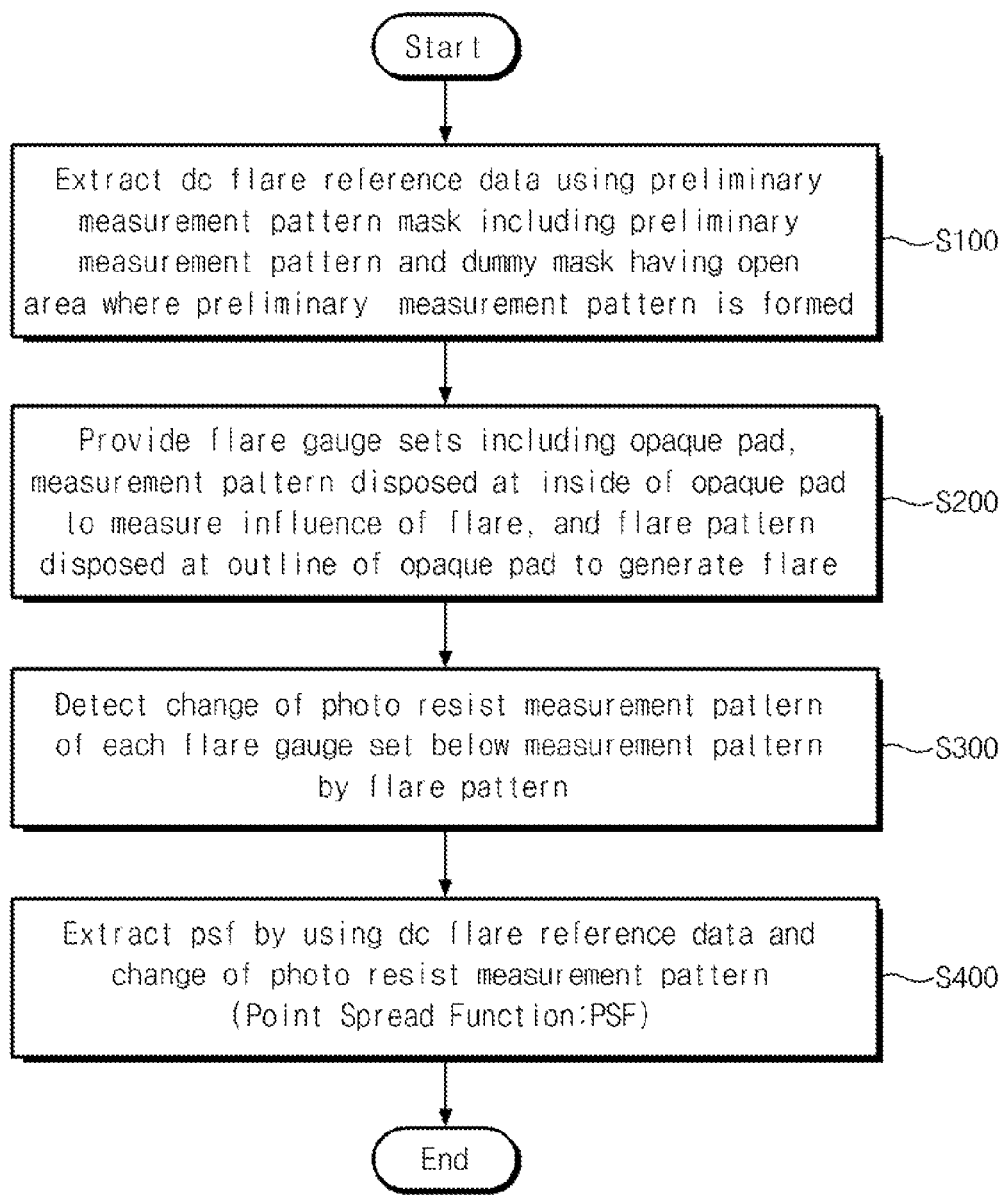
FIGS. 3 and 4 are flowcharts illustrating a flare evaluation method according to an embodiment of the inventive concept.
Figure 4:
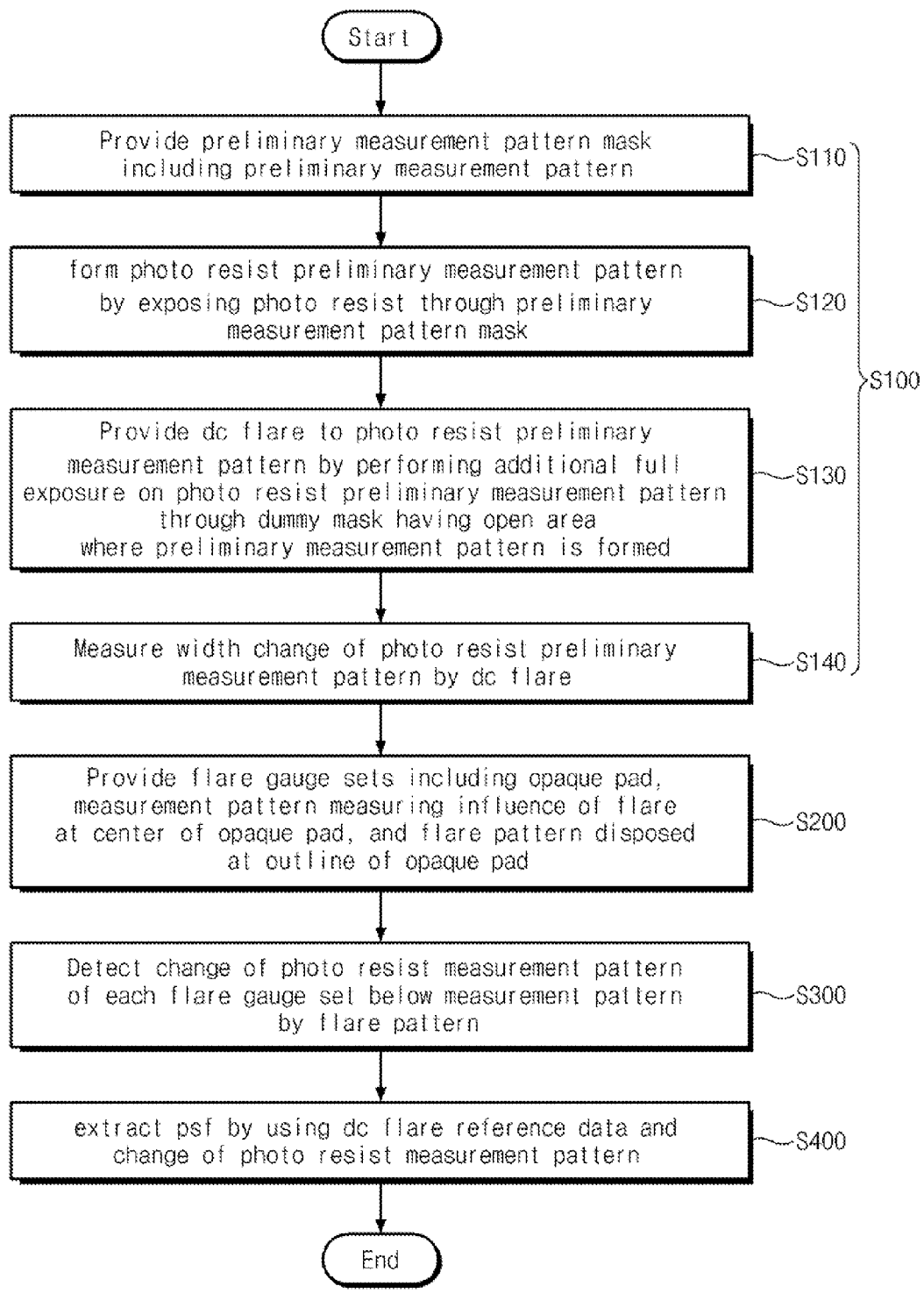

FIGS. 3 and 4 are flowcharts illustrating a flare evaluation method according to an embodiment of the inventive concept.

Referring to FIGS. 3 and 4, a flare evaluation method may be applied to an EUV exposure apparatus. A flare evaluation method according to an embodiment of the inventive concept includes operation S100, operation S200, operation S300, and operation S400. Referring to FIG. 3, in operation S100, DC flare reference data are extracted using a preliminary measurement pattern mask and a dummy mask having an open area where a preliminary measurement pattern is formed. In operation S200, a plurality of flare gauge sets are provided. The flare gauge sets include an opaque pad, a measurement pattern for measuring the influence of a flare at the center of the opaque pad, and a flare pattern for causing a flare outside of the opaque pad. In operation S300, a change of a photo resist measurement pattern is detected by the flare pattern and the measurement pattern for each flare gauge set. The outer radius of each flare gauge increases by a predetermined amount. In operation S400, a PSF can be obtained using the DC flare reference data and the change of the photo resist measurement pattern.

Referring now to FIG. 4, operation 100 for extracting the DC flare reference data according to an embodiment of the inventive concept includes operation S110, operation S120, operation S130, and operation S140. In operation S110, the preliminary measurement pattern mask including the preliminary measurement pattern is provided. In operation S120, a photo resist preliminary measurement pattern is formed by exposing a photo resist through the preliminary measurement pattern mask. In operation S130, the photo resist preliminary measurement pattern is exposed to a DC flare through the dummy mask having an open area where the preliminary measurement pattern is formed. In the operation S140, a width change of the photo resist preliminary measurement pattern is measured by the DC flare.

Figure 5A:
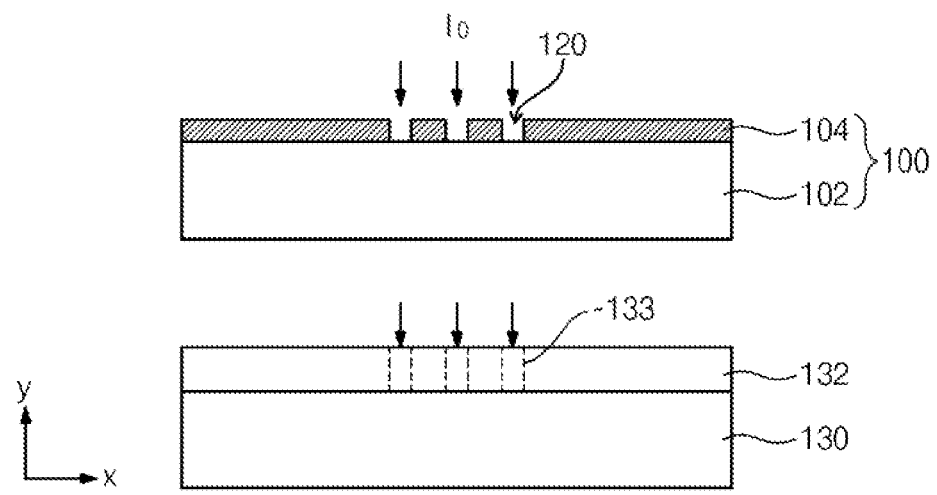
FIGS. 5A through 5C are views illustrating a method of extracting DC flare reference data according to an embodiment of the inventive concept.
Figure 5B:
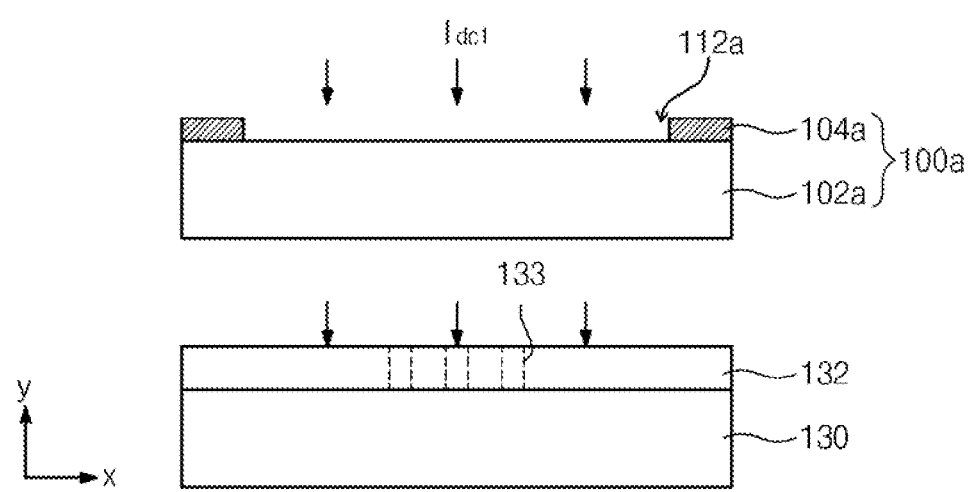
Figure 5C:
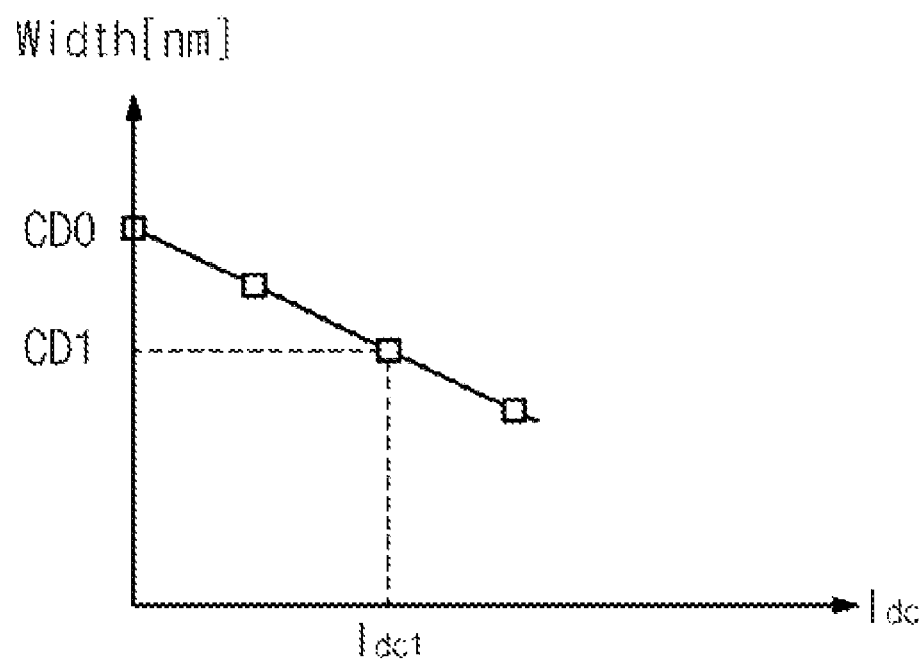
Figure 6A:
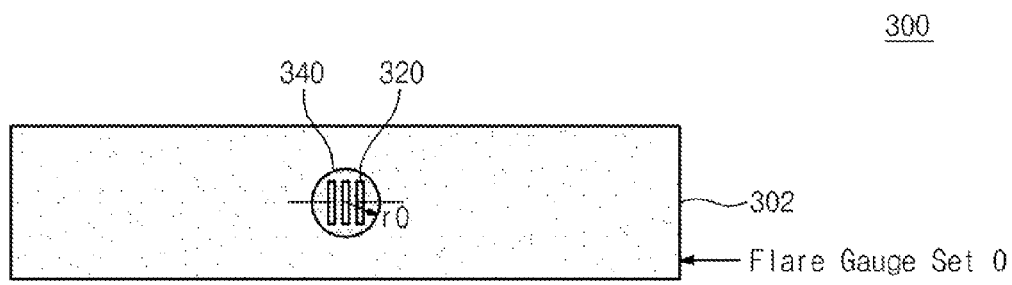
FIGS. 6A through 6D are views illustrating a flare mask according to an embodiment of the inventive concept.
Figure 6B:
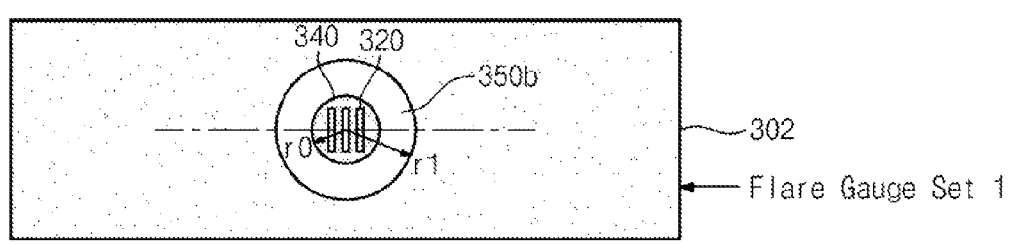
Figure 6C:
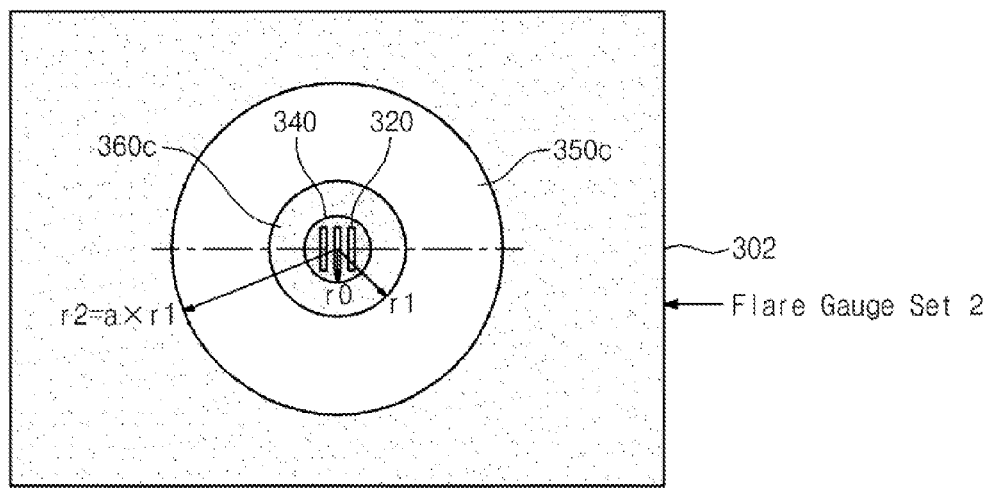
Figure 6D:
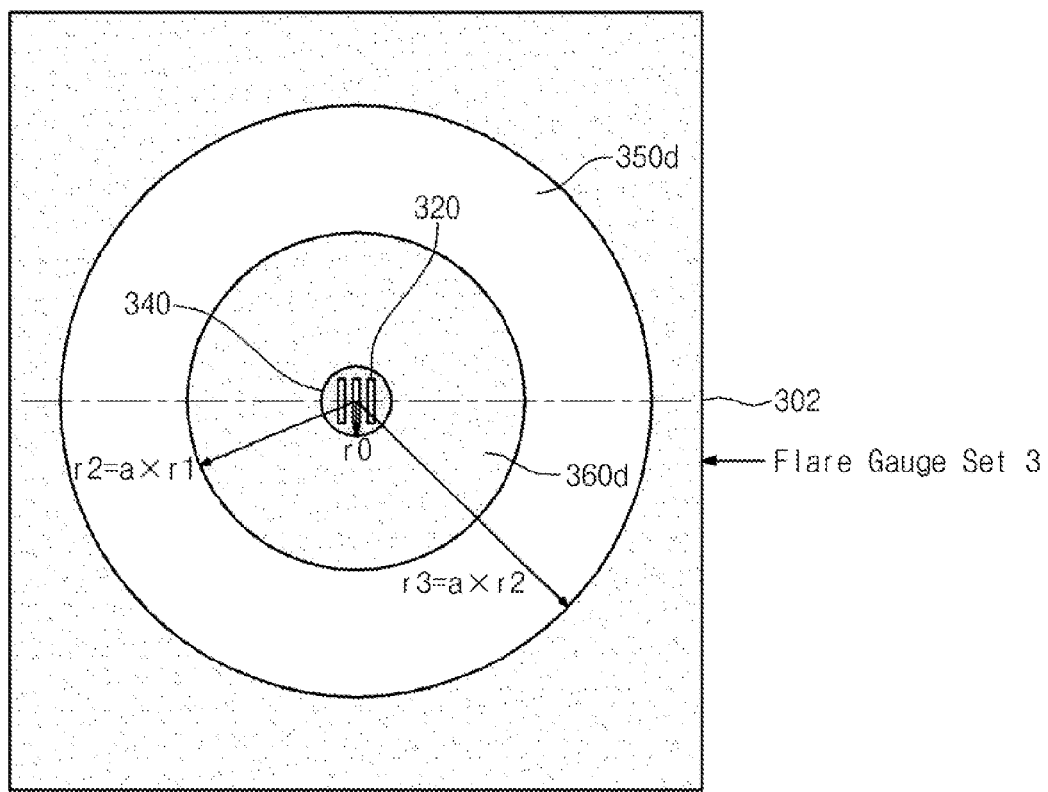

FIGS. 5A through 5C are views illustrating a method of extracting DC flare reference data according to an embodiment of the inventive concept.

Referring to FIG. 5A, a preliminary measurement pattern mask 100 includes a preliminary measurement pattern 120. The preliminary measurement pattern mask 100 may include a mask layer 104 disposed above or below a mask substrate 102. The mask layer 104 may be a single layer or a multi-layer. The mask layer 104 may include chrome.

The preliminary measurement pattern 120 may include an LS pattern and/or a contact hole pattern of various shapes. The preliminary measurement pattern mask 100 and a substrate 130 are aligned with each other. A photo resist 132 may be formed on the substrate 130. The photo resist 132 may be disposed on an image plane of the preliminary measurement pattern 120.

The first exposure $I_0$ is performed on the photo resist 132 using the preliminary measurement pattern mask 100 to form a photo resist preliminary measurement pattern 133. That is, the photo resist 132, exposed by the first exposure $I_0$ to light having an intensity greater than a critical intensity Icritical, reacts chemically to form a photo resist preliminary measurement pattern 133. The first exposure $I_0$ may be performed using an EUV exposure apparatus.

Referring to FIG. 5B, a dummy mask 100a is formed that includes a dummy pattern 112a having an open area corresponding to, where the preliminary measurement pattern 133 will be formed. The dummy mask 100a may include a dummy mask layer 104a formed above or below a dummy mask substrate 102a.

Next, an additional full exposure may be performed on the photo resist preliminary measurement pattern 133 using the dummy mask 100a. In this case, a DC flare value $I_{dc1}$ is provided to the photo resist preliminary measurement pattern 133. The dummy pattern 112a may be aligned with the photo resist preliminary measurement pattern 133. The exposure apparatus provides the predetermined DC flare value $I_{dc1}$ to the photo resist preliminary measurement pattern 133. The DC flare value $I_{dc1}$ may be less than a value of the first exposure $I_0$. The DC flare value $I_{dc1}$ may change a width of the photo resist preliminary measurement pattern 133.

Referring to FIG. 5C, a width of the photo resist preliminary measurement pattern 133 can be changed by the DC flare value $I_{dc1}$. The width of the photo resist preliminary measurement pattern 133 is determined while adjusting an amount of the DC flare value $I_{dc1}$. That is, the width of the photo resist preliminary measurement pattern 133 measured as a function of the DC flare value $I_{dc1}$ is the DC flare reference data. CD0 denotes the width if there is no DC flare. CD1 denotes the width for the DC flare value $I_{dc1}$.

FIGS. 6A through 6D are views illustrating a flare mask according to an embodiment of the inventive concept.

Referring to FIGS. 6A through 6D, a flare mask 300 may include a plurality of flare gauge sets 0 to 3. The flare gauge sets are spaced apart from each other in a mask substrate 302. The mask substrate 302 may include a chrome layer deposited on its surface.

The flare gauge sets 0 to 3 include an opaque pad 340, a measurement pattern 320 for measuring influence of a flare at the center of the opaque pad 340, and flare patterns 350b, 350c, and 350d disposed outside of the opaque pad 340. According to the flare gauge sets 0 to 3, the outer radii of the flare patterns 350b, 350c, and 350d increases by a predetermined amount.

The flare mask 300 may include a reference flare gauge set, the flare gauge set 0. The reference flare gauge set may include the opaque pad 340 and the measurement pattern 320 at the center of the opaque pad 340. The measurement pattern 320 of the reference flare gauge set will not be influenced by the flare.

The measurement pattern 320 may be an LS pattern. The width may be of the same order as a wavelength of an exposure apparatus. The measurement pattern 320 may include a plurality of lines. The line may be a region for transmitting light through the mask substrate 302. The measurement pattern 320 may include various LS patterns. The measurement pattern 320 may also be a contact hole pattern.

The opaque pad 340 may be disposed to surround the measurement pattern 320. The shape of the opaque pad 340 may be circular or polygonal: The opaque pad 340 may be a region that does not transmit light through the mask substrate 302.

The flare patterns 350b, 350c, and 350d may be disposed to surround the opaque pad 340. The flare patterns 350b, 350c, and 350d may be a clear region that can transmit light through the flare mask 300. The flare patterns 350b, 350c, and 350d may have a round donut shape. The shape of the flare patterns 350b, 350c, and 350d may also be a polygon. The inner radii of the flare patterns 350b, 350c, and 350d may have a predetermined ratio with respect to the outer radius of the opaque pad 340. The outer radii of the flare patterns 350b, 350c, and 350d increase by a predetermined amount according to the flare gauge set. The flare patterns 350b, 350c, and 350d may provide the flare to an image of the measurement pattern 320. The outer radii of the flare patterns 350b, 350c, and 350d increase according to the relational equation $r_{n+1}=a \times r_n$, where a is a real number greater than 1.

In the second and third flare gauge sets, dark patterns 360c and 360d may be disposed between the opaque pad 340 and the flare patterns 350c and 350d. The outer radii of the dark patterns 360c and 360d are reduced by a predetermined amount from the outer radii of the flare patterns 350c and 350d. The outer radii of the dark patterns 360c and 360d may be identical to the inner radii of the flare patterns 350c and 350d. The dark patterns 360c and 360d may be a region that does not transmit light. The dark patterns 360c and 360d may have a round donut shape. The inner radii of the dark patterns 360c and 360d may have a predetermined value depending on the flare gauge set.

The first flare gauge set may include the first flare pattern 350b. The second flare gauge set may include the second flare pattern 350c. The third flare gauge set may include the third flare pattern 350d. The outer radii of the first to third flare patterns 350b, 350c, and 350d are r1, r1×a, and r1×a×a, respectively. The inner radii of the first to third flare patterns 350b, 350c, and 350d are r0, r1, and r1×a, respectively.

Accordingly, a flare due to the second flare pattern 350c of the second flare gauge set may be less than a flare due to the first flare pattern 350b of the first flare gauge set. In addition, the flare due to the third flare pattern 350d of the third flare gauge set may be less than the flare due to the second flare pattern 350c of the second flare gauge set.

Next, a change of a photo resist measurement pattern below the measurement pattern 320 can be detected by the flare patterns 350b, 350c, and 350d for each of the flare gauge sets. The reference flare gauge set may provide the width of a reference photo resist measurement pattern without the flare.

Accordingly, as the strength of the flare increases, the width change of a photo resist measurement pattern increases with respect to the reference photo resist measurement pattern. The change of the width reflects the strength of the flare.

Figure 7A:
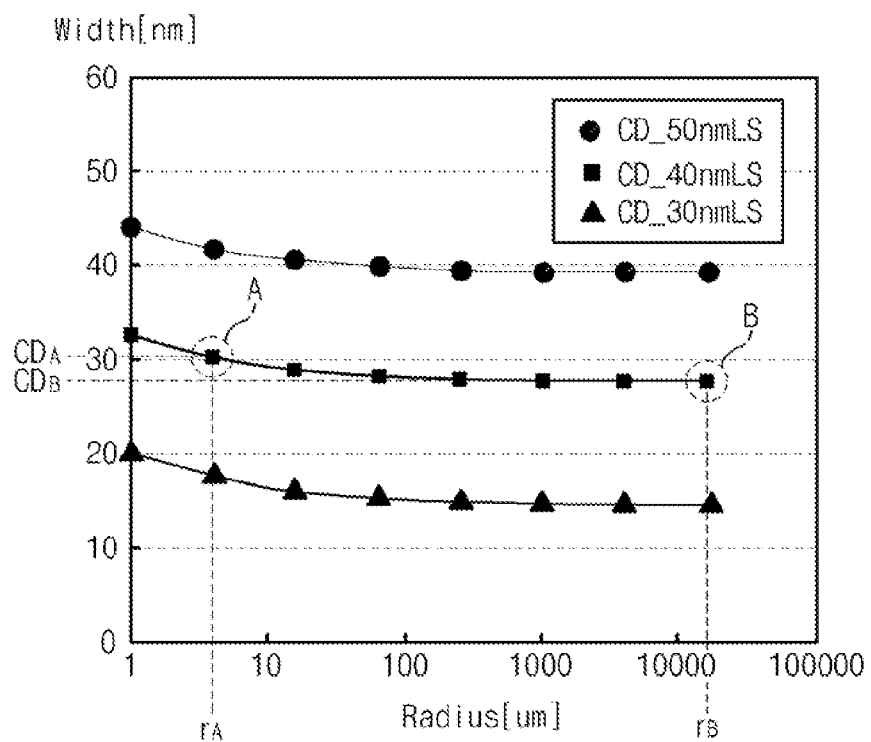
FIGS. 7A through 7D are views illustrating a flare evaluation method according to an embodiment of the inventive concept.
Figure 7B:
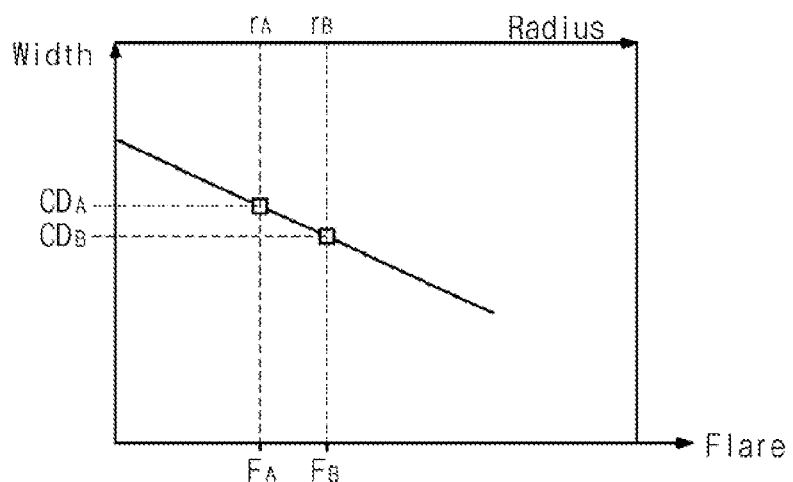
Figure 7C:
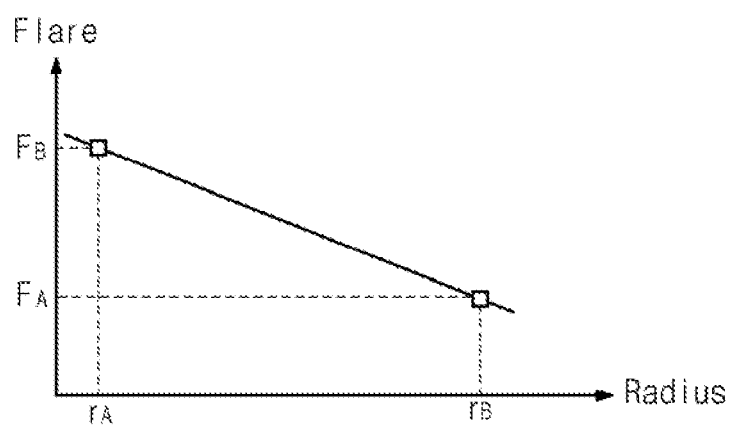
Figure 7D:
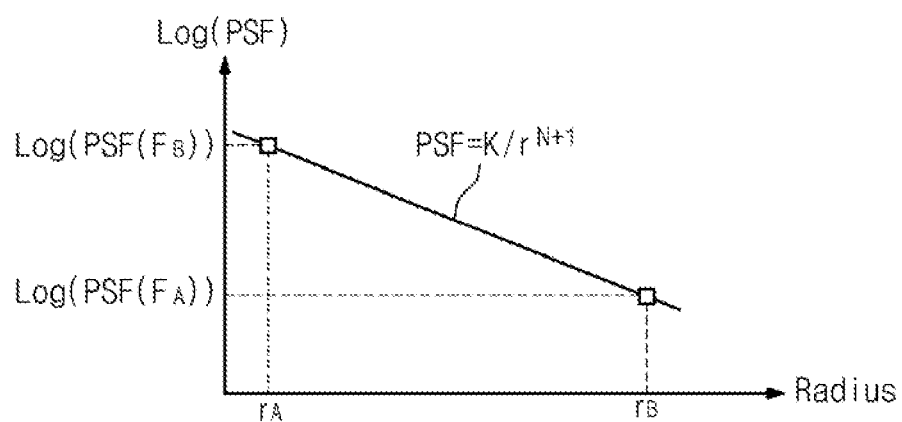
Figure 8A:
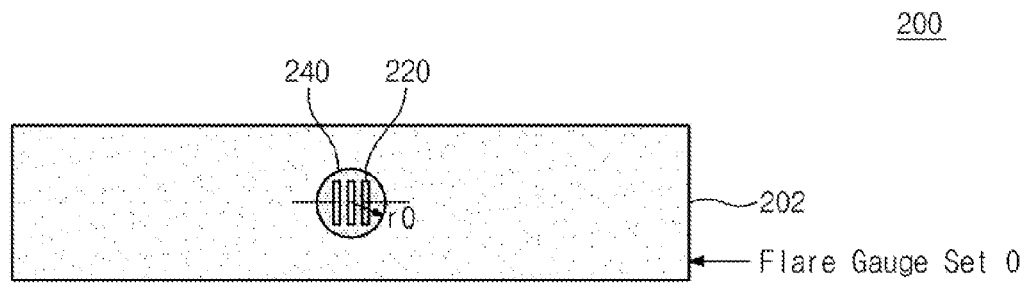
FIGS. 8A through 8D are views illustrating a flare mask according to another embodiment of the inventive concept.
Figure 8B:
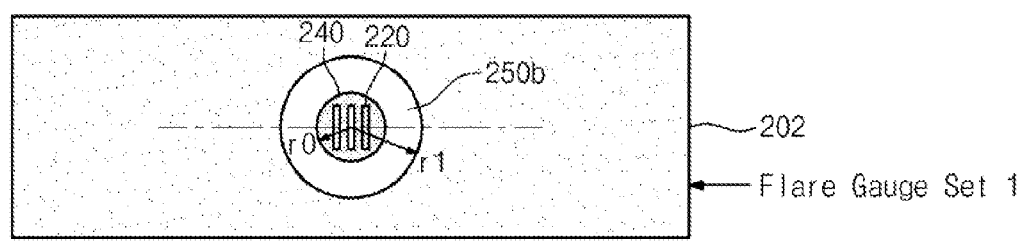
Figure 8C:
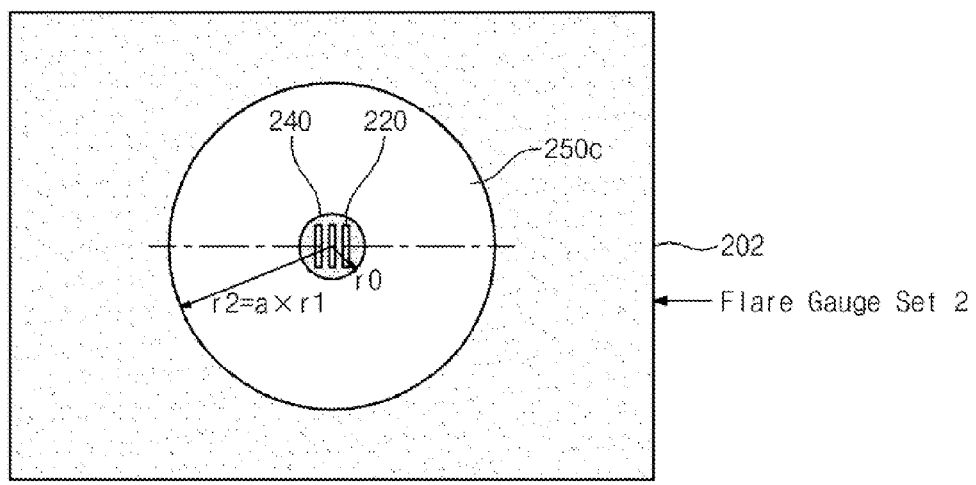
Figure 8D:
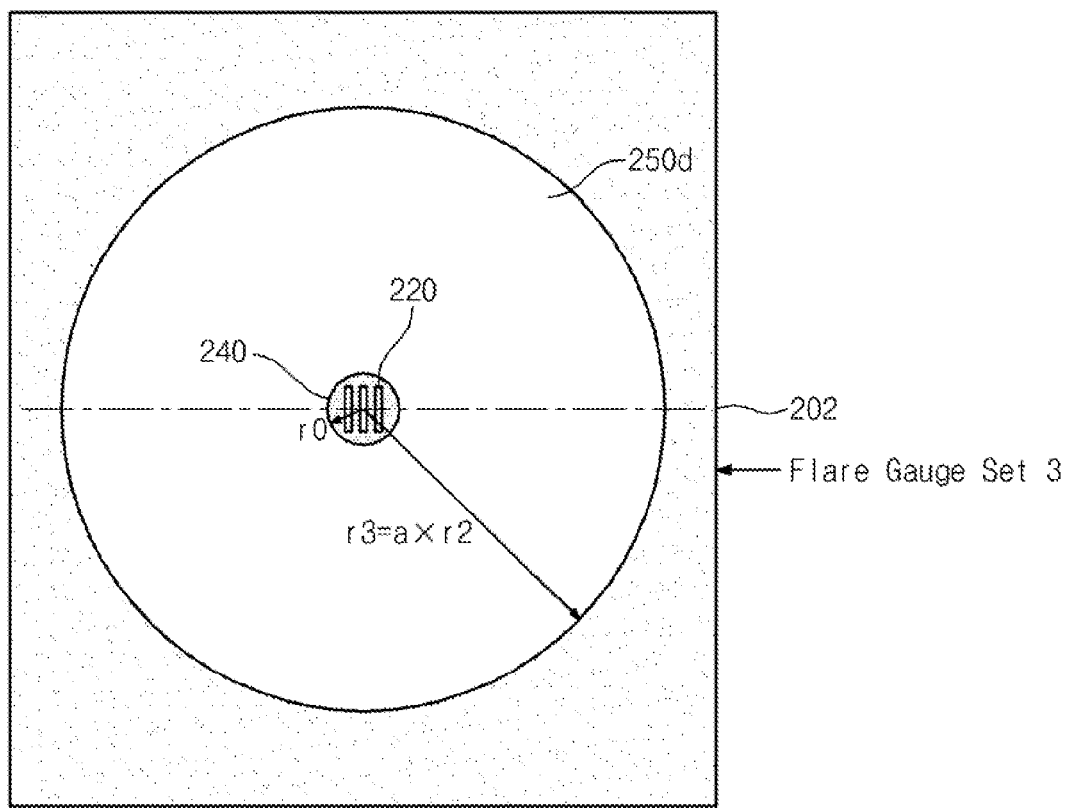
Figure 9A:
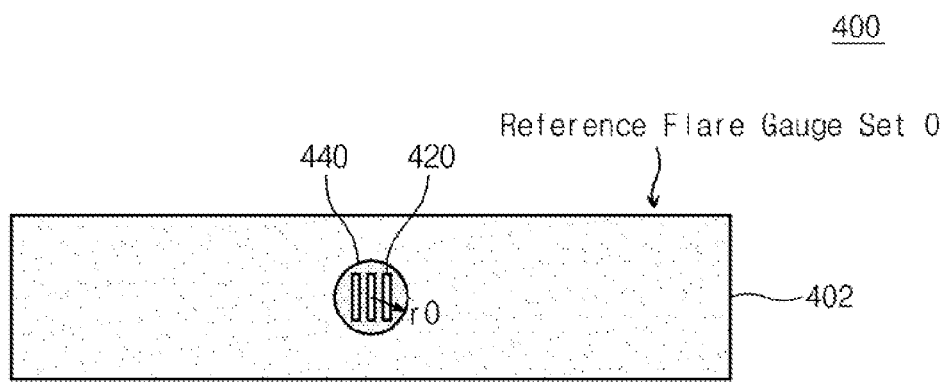
FIGS. 9A through 9G are views illustrating a flare mask according to other embodiments of the inventive concept.
Figure 9B:
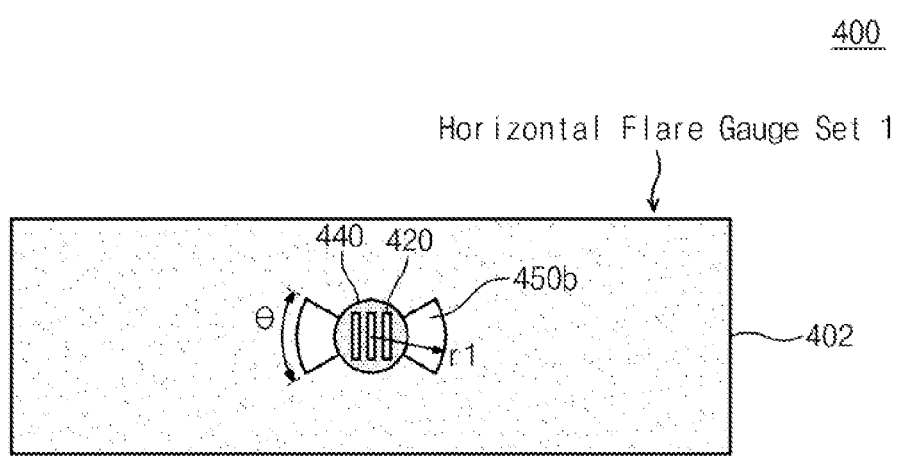
Figure 9C:
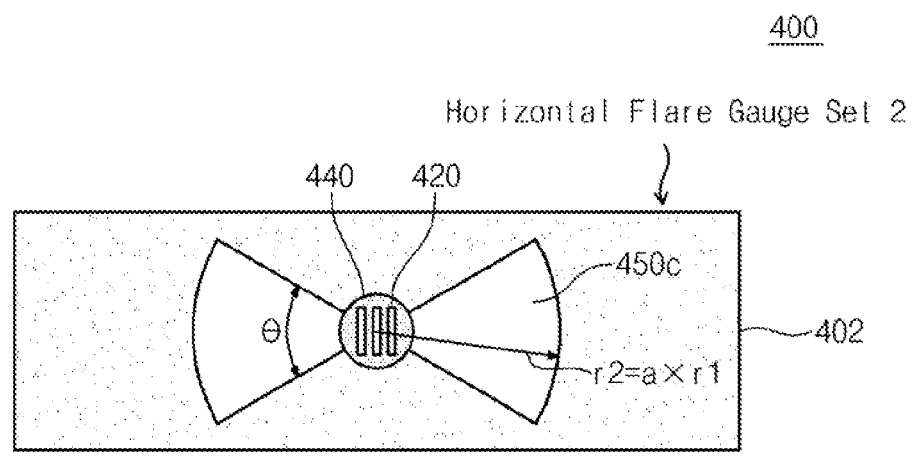
Figure 9D:
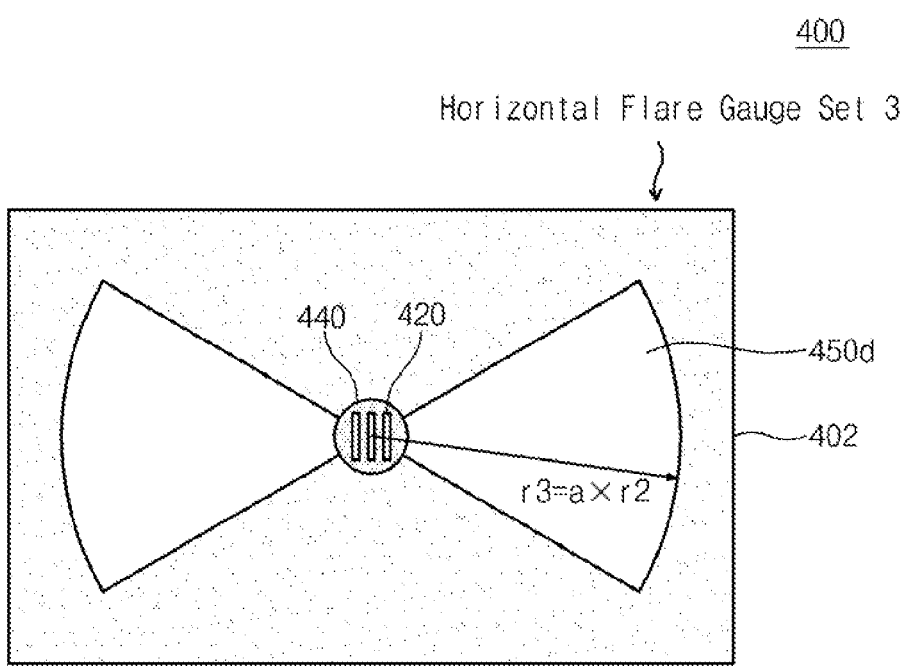
Figure 9E:
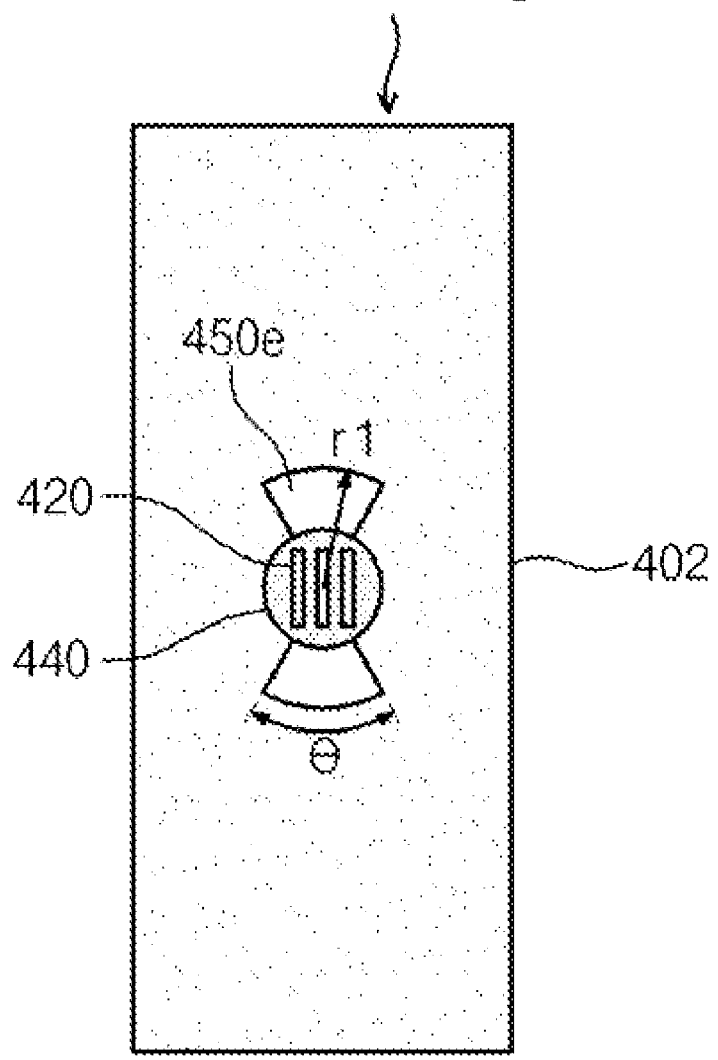
Figure 9F:
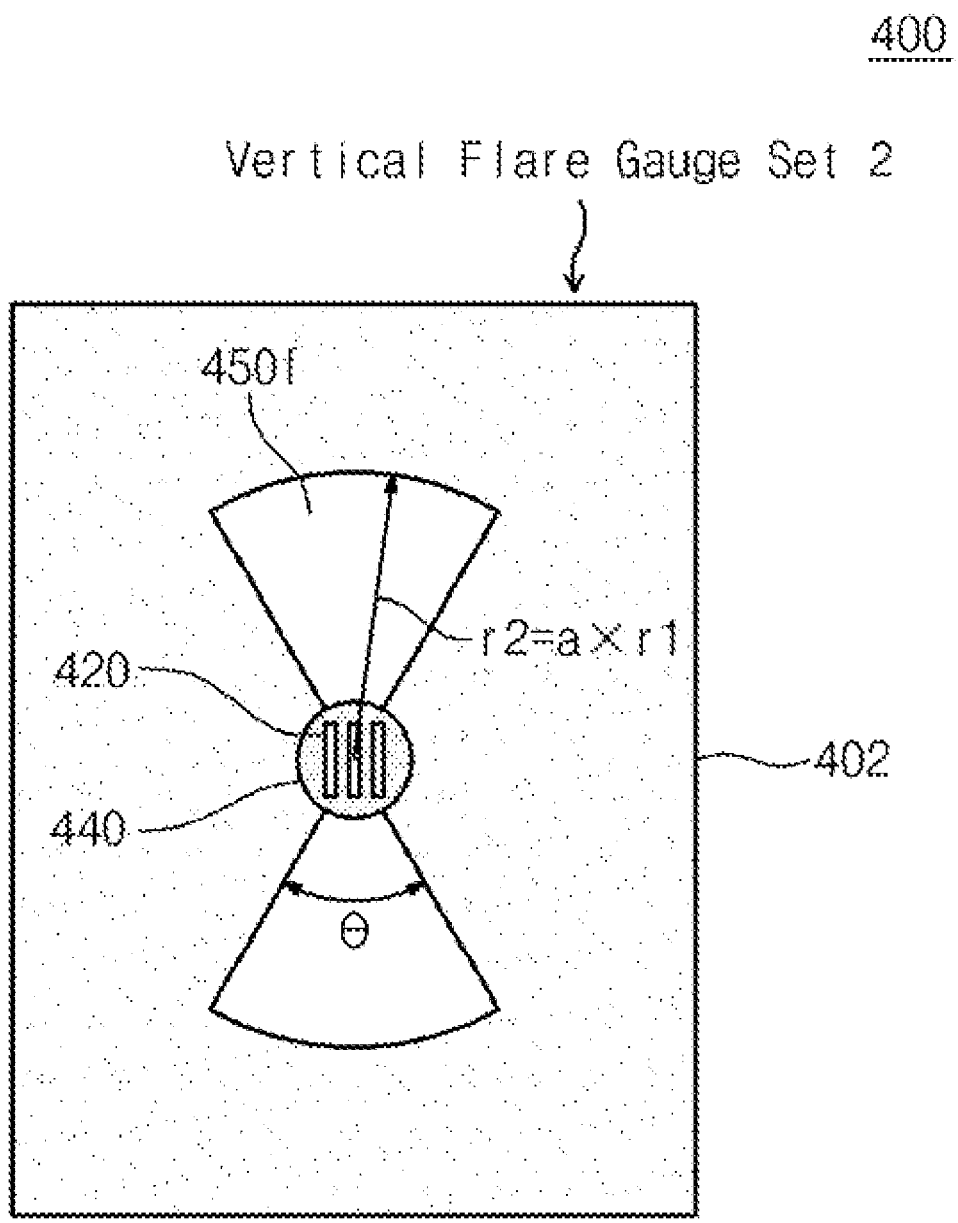
Figure 9G:
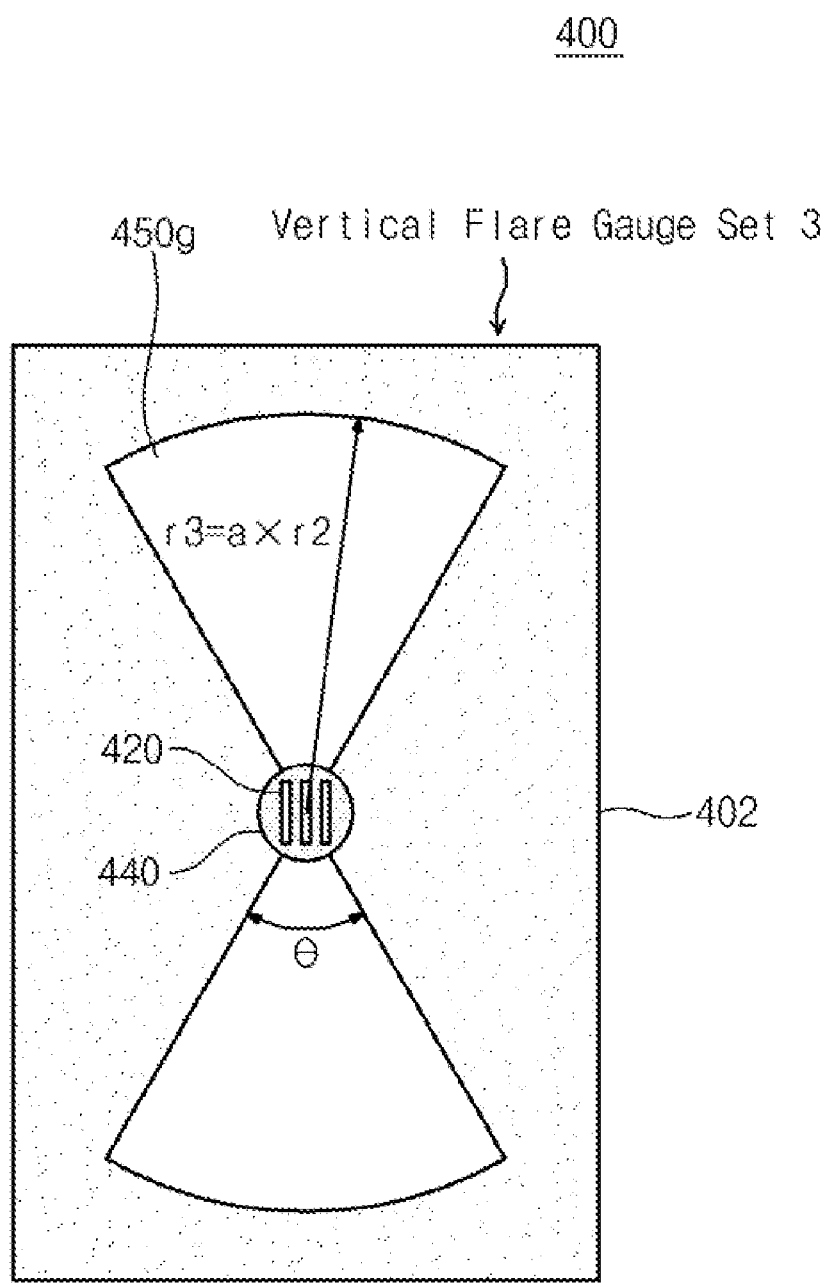

FIGS. 7A through 7D are views illustrating a flare evaluation method according to an embodiment of the inventive concept. FIG. 7A is graph of simulation results representing a change of a photo resist measurement pattern width as a function of the outer radius of a flare pattern. FIG. 7B illustrates the DC flare reference data of FIG. 5C and a change of the photo resist measurement pattern width as a function of the outer radius of the flare pattern at the same time. FIG. 7C illustrates flare intensity as a function of the outer radius of a flare pattern. FIG. 7D illustrates a PSF as a function of the outer radius of a flare pattern.

Referring to FIGS. 6A through 6D and FIG. 7A, a width of a photo resist measurement pattern can be measured as a function of the outer radius r of the flare pattern. The width of the photo resist measurement pattern may differ for each of the flare gauge sets. The width and the outer radius of the point A are $CD_A$ and $r_A$, respectively. The width and the outer radius of the point B are $CD_B$ and $r_B$, respectively.

Referring to FIGS. 7B and 5C, flares $F_A$ and $F_B$ corresponding to the widths $CD_A$ and $CD_B$ and the radii $r_A$ and $r_B$ of the flare pattern can be obtained. Lines representing the widths as a function of the flare can be obtained by DC flare reference data.

Referring to FIG. 7C, a flare according to the outer radius of a flare pattern can be obtained. To simplify the description, data of two points are shown, although more than two points could be shown. Accordingly, the data can be fit to the lines connecting the two points.

Referring to FIG. 7D, the flare of FIG. 7C is converted into a PSF. Since a geometric structure of the flare pattern is predetermined, the flare and the PSF can be converted into each other.

The PSF as a function of the outer radius of the flare pattern can fit from the data, from which a value for N can be determined.

FIGS. 8A through 8D are views illustrating a flare mask according to another embodiment of the inventive concept.

Referring to FIGS. 8A through 8D, the flare mask 200 may include a plurality of flare gauge sets 1 to 3. The flare gauge sets include an opaque pad 240, a measurement pattern 220 for measuring influence of a flare at the center of the opaque pad 240, and flare patterns 250b, 250c, and 250d disposed outside of the opaque pad 240. According to the flare gauge set, the outer radii of the flare patterns 250b, 250c, and 250d increases by a predetermined amount. The flare mask 200 may include a reference flare gauge set, flare gauge set 0. The reference flare gauge set may include the opaque pad 240 and the measurement pattern 220 at the center of the opaque pad 240.

The measurement pattern 220 may be an LS pattern. The width may be of same order as the wavelength of an exposure apparatus. The measurement pattern 220 may include a plurality of lines. The line may be a region for transmitting light through a mask substrate 202.

The opaque pad 240 may be disposed to surround the measurement pattern 220. The shape of the opaque pad 240 may be circular or polygonal. The opaque pad 240 may be a region that does not transmit light through the mask substrate 202.

The flare patterns 250b, 250c, and 250d may be disposed to surround the opaque pad 240. The flare patterns 250b, 250c, and 250d may be a clear region that can transmit light through the flare mask 200. The flare patterns 250b, 250c, and 250d may have a round donut shape. The shape of the flare patterns 250b, 250c, and 250d may also be a polygon. The inner radii of the flare patterns 250b, 250c, and 250d may be identical to the outer radius of the opaque pad 240. The outer radii of the flare patterns 250b, 250c, and 250d increase by a predetermined amount depending on the flare gauge set. The outer radii of the flare patterns 250b, 250c, and 250d increase according to a relational equation $r_{n+1}=a \times r_n$, where a is a real number greater than 1.

The flare gauge set may include a first flare gauge set, a second flare gauge set, and a third flare gauge set. The first flare gauge set may include the first flare pattern 250b. The second flare gauge set may include the second flare pattern 250c. The third flare gauge set may include the third flare pattern 205d. The outer radii of the first to third flare patterns 250b, 250c, and 250d are r1, r1×a, and r1×a×a, respectively. The inner radii of the first to third flare patterns 250b, 250c, and 250d may be r0.

Accordingly, a cumulative flare due to the second flare pattern 250c of the second flare gauge set may be greater than that due to the first flare pattern 250b of the first flare gauge set. Additionally, a cumulative flare due to the third flare pattern 250d of the third flare gauge set may be greater than that due to the second flare pattern 250c of the second flare gauge set Next, the flare patterns 250b, 250c, and 250d can provide the cumulative flare to a photo resist measurement pattern below the measurement pattern 220 for each of the flare gauge sets. The reference flare gauge set provides a width of a reference photo resist measurement pattern. The reference photo resist measurement pattern will not be influenced by the flare.

Accordingly, as the strength of the cumulative flare increases, a change of the photo resist measurement pattern width increases with respect to the reference photo resist measurement pattern. The change of the width reflects the strength of the cumulative flare. Like the method of FIG. 5, an N value of a PSF can be obtained.

FIGS. 9A through 9G are views illustrating a flare mask according to another embodiment of the inventive concept. Description overlapping with that of FIGS. 8A through 8D will be omitted.

Referring to FIGS. 9A through 9G, a flare mask 400 may include a plurality of flare gauge sets. The flare gauge set may include a common flare gauge set, reference flare gauge set 0, a horizontal flare gauge set, including horizontal flare gauge sets 1 to 3, and a vertical flare gauge set, including vertical flare gauge sets 1 to 3. The flare gauge set may include an opaque pad 440, a measurement pattern 420 for measuring influence of a flare at the center of the opaque pad 440, and flare patterns 450b to 450g disposed outside of the opaque pad 440.

In the horizontal flare gauge sets, the outer radii of the flare patterns 450b, 450c, and 450d increases by a predetermined amount. In the vertical flare gauge sets, the outer radii of the flare patterns 450e, 450f, and 450g increases by a predetermined amount.

The flare mask 400 may include the reference flare gauge set 0. The reference flare gauge set 0 may include the opaque pad 440 and the measurement pattern 420 at the center of the opaque pad 440.

The shape of the flare patterns 450b to 450g may be that of a circular washer about the opaque pad 440 that is symmetrically truncated. The inside truncation angle θ may be between more than about 0° and less and 180°. The circular washer is disposed horizontal or vertical to the measurement pattern 420 to measure an asymmetry or anisotropy in the flare pattern. The asymmetry of the flare pattern may reflect an asymmetry of an exposure apparatus.

A cumulative flare due to the horizontal flare gauge set including the same flare pattern may be different from a cumulative flare due to the vertical flare gauge set. That is, a width of a photo resist measurement pattern formed by the horizontal flare gauge set may be different from a width of a photo resist measurement pattern formed by the vertical flare gauge set. That is, the width difference may be due to an asymmetry of an exposure apparatus.

Like the method of FIG. 5, an N value of a PSF for the vertical flare gauge set can be obtained. Additionally, an N value of a PSF for the horizontal flare gauge set can be obtained.

Flare evaluation methods according to embodiments of the inventive concept can easily measure a long range flare and at the same time extract a PSF.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A flare evaluation method of an extreme ultraviolet (EUV) exposure apparatus, the method comprising:

extracting direct constant (DC) flare reference data using a preliminary measurement pattern mask including a dummy mask having an open region wherein a preliminary measurement pattern is formed;

providing a plurality of flare gauge sets, each set including an opaque pad, a measurement pattern, and a flare pattern, the measure pattern being disposed at an inside of the opaque pad to measure influence of a flare, the flare pattern being disposed at an outside of the opaque pad to generate the flare; and detecting a change of a photo resist measurement pattern caused by the flare pattern and the measurement pattern for each of the flare gauge sets, wherein an outer radius of the flare pattern increases by a predetermined amount according to the flare gauge set, and a shape of the flare pattern is a truncated round washer disposed symmetrically about the opaque pad.

2. The method of claim 1, further comprising obtaining a point spread function (PSF) using the DC flare reference data and the change of the photo resist measurement pattern.

3. The method of claim 1, wherein extracting the DC flare reference data comprises:

providing the preliminary measurement pattern mask including the preliminary measurement pattern;

forming a photo resist preliminary measurement pattern by exposing a photo resist through the preliminary measurement pattern mask;

exposing the photo resist preliminary measurement pattern to a DC flare through the dummy mask having the open region where the preliminary measurement pattern is formed; and measuring a width change of the photo resist preliminary measurement pattern caused by the DC flare.

4. The method of claim 1, wherein an inner radius of the flare pattern is uniform in the flare gauge set.

5. The method of claim 1, wherein an angle of the truncated round washer is between more than 0° and less than 180°.

6. The method of claim 1, wherein the truncated round washer is disposed in a horizontal direction or a vertical direction to measure an anisotropy in the flare pattern.

7. The method of claim 1, wherein the measurement pattern comprises one of a line/space pattern or a hole pattern.

8. The method of claim 1, wherein a width of the measurement pattern is less than a wavelength of the EUV exposure apparatus.

9. The method of claim 1, further comprising a dark pattern between the opaque pattern and the flare pattern, wherein an outer radius of the dark pattern is reduced by a predetermined amount from the outer radius of the flare pattern.

10. A flare evaluation method of an extreme ultraviolet (EUV) exposure apparatus, the method comprising:

providing a preliminary measurement pattern mask including a dummy mask having an open region wherein a preliminary measurement pattern is formed;

forming a photo resist preliminary measurement pattern by exposing a photo resist through the preliminary measurement pattern mask;

exposing the photo resist preliminary measurement pattern to a direct constant (DC) flare through the dummy mask having the open region where the preliminary measurement pattern is formed;

providing a plurality of flare gauge sets, each set including an opaque pad, a measurement pattern, and the flare pattern, the measure pattern being disposed at an inside of the opaque pad to measure influence of a flare, the flare pattern being disposed at an outside of the opaque pad to generate the flare;

measuring a width change of the photo resist preliminary measurement pattern caused by the DC flare, to extract DC flare reference data; and detecting a change of a photo resist measurement pattern caused by the flare pattern and the measurement pattern for each of the flare gauge sets, wherein a shape of the flare pattern is a truncated round washer disposed symmetrically in a horizontal direction or a vertical direction about the opaque pad.

11. The method of claim 10, wherein an outer radius of the flare pattern increases by a predetermined amount according to the flare gauge set, and an inner radius of the flare pattern is uniform in the flare gauge set.

12. The method of claim 10, further comprising a dark pattern between the opaque pattern and the flare pattern, wherein an outer radius of the dark pattern is reduced by a predetermined amount from the outer radius of the flare pattern.

13. The method of claim 10, further comprising obtaining a point spread function (PSF) using the DC flare reference data and the change of the photo resist measurement pattern.

14. A flare evaluation method of an extreme ultraviolet (EUV) exposure apparatus, the method comprising:

extracting direct constant (DC) flare reference data using a preliminary measurement pattern mask including a dummy mask having an open region wherein a preliminary measurement pattern is formed;

providing a plurality of flare gauge sets, each set including an opaque pad, a measurement pattern, and a flare pattern, the measure pattern being disposed at an inside of the opaque pad to measure influence of a flare, the flare pattern being disposed at an outside of the opaque pad to generate the flare; and detecting a change of a photo resist measurement pattern caused by the flare pattern and the measurement pattern for each of the flare gauge sets, wherein an outer radius of the flare pattern increases by a predetermined amount according to the flare gauge set, and a distance between an inner radius and the outer radius of the flare pattern increases by a predetermined amount according to the flare gauge set.

15. The method of claim 14, further comprising obtaining a point spread function (PSF) using the DC flare reference data and the change of the photo resist measurement pattern.

16. The method of claim 14, wherein extracting the DC flare reference data comprises:

providing the preliminary measurement pattern mask including the preliminary measurement pattern;

forming a photo resist preliminary measurement pattern by exposing a photo resist through the preliminary measurement pattern mask;

exposing the photo resist preliminary measurement pattern to a DC flare through the dummy mask having the open region where the preliminary measurement pattern is formed; and measuring a width change of the photo resist preliminary measurement pattern caused by the DC flare.

17. The method of claim 14, wherein an inner radius of the flare pattern is uniform in the flare gauge set.

18. The method of claim 14, wherein a shape of the flare pattern is a truncated round washer disposed symmetrically about the opaque pad.

19. The method of claim 14, wherein a width of the measurement pattern is less than a wavelength of the EUV exposure apparatus.

20. The method of claim 14, further comprising a dark pattern between the opaque pattern and the flare pattern, wherein an outer radius of the dark pattern is reduced by a predetermined amount from the outer radius of the flare pattern.

* * * * *